(12) United States Patent
Choi et al.

(10) Patent No.: US 9,336,894 B2
(45) Date of Patent: May 10, 2016

(54) MEMORY DEVICE INCLUDING NONVOLATILE MEMORY CELL

(71) Applicant: Samsung Electronics Co., Ltd., Suwon-si (KR)

(72) Inventors: Hyun-Min Choi, Uiwang-si (KR); Shigenobu Maeda, Seongnam-si (KR); Ji-Hoon Yoon, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/753,620

(22) Filed: Jun. 29, 2015

(65) Prior Publication Data

US 2016/0093398 A1    Mar. 31, 2016

(30) Foreign Application Priority Data

Sep. 30, 2014   (KR) .................. 10-2014-0131451

(51) Int. Cl.
| | |
|---|---|
| *G11C 17/00* | (2006.01) |
| *G11C 17/08* | (2006.01) |
| *G11C 13/00* | (2006.01) |

(52) U.S. Cl.
CPC .............. *G11C 17/08* (2013.01); *G11C 13/004* (2013.01); *G11C 13/0011* (2013.01); *G11C 13/0069* (2013.01); *G11C 13/0097* (2013.01)

(58) Field of Classification Search
USPC ............. 365/103, 104, 94; 257/315, 316, 321
See application file for complete search history.

(56) References Cited

U.S. PATENT DOCUMENTS

| | | | |
|---|---|---|---|
| 6,740,927 B1 * | 5/2004 | Jeng ...................... | H01L 27/115 25/315 |
| 8,122,307 B1 | 2/2012 | Lindhorst et al. | |
| 8,174,063 B2 | 5/2012 | Lu et al. | |
| 8,199,590 B1 | 6/2012 | Novosel et al. | |
| 8,344,445 B2 | 1/2013 | Lu et al. | |
| 8,390,056 B2 | 3/2013 | Lu et al. | |
| 8,604,538 B2 | 12/2013 | Lu et al. | |
| 8,638,589 B2 | 1/2014 | Lu et al. | |
| 2006/0255385 A1 * | 11/2006 | Schoellkopf ........ | H01L 27/1022 257/296 |
| 2012/0047322 A1 | 2/2012 | Chung | |
| 2013/0077382 A1 | 3/2013 | Cho et al. | |
| 2013/0080693 A1 | 3/2013 | Kim et al. | |
| 2013/0120023 A1 | 5/2013 | Liu | |
| 2014/0098591 A1 | 4/2014 | Chen et al. | |

FOREIGN PATENT DOCUMENTS

| | | |
|---|---|---|
| JP | 2013-012714 | 1/2013 |
| KR | 2010-0078226 | 7/2010 |

OTHER PUBLICATIONS

Novocell Semiconductor / NovoBytes MTP / 1 Page.

* cited by examiner

*Primary Examiner* — Vu Le

(74) *Attorney, Agent, or Firm* — Muir Patent Law, PLLC

(57) ABSTRACT

A memory device may include nonvolatile memory cells. A first memory cell of the nonvolatile memory cells may have a first resistance value in a first state and a second memory cell of the nonvolatile memory cells may have a second resistance value less than the first resistance value in a second state. A third memory cell of the nonvolatile memory cells may have a third resistance value less than the first resistance value and greater than the second resistance value in a third state, and a fourth memory cell of the nonvolatile memory cells may have a fourth resistance value less than the third resistance value and greater than the second resistance value in a fourth state.

20 Claims, 12 Drawing Sheets

MEMORY DEVICE INCLUDING NONVOLATILE MEMORY CELL

CROSS-REFERENCE TO RELATED APPLICATIONS

This application claims priority under 35 U.S.C. §119 to Korean Patent Application No. 10-2014-0131451, filed on Sep. 30, 2014 in the Korean Intellectual Property Office, the disclosure of which is incorporated herein in its entirety by reference.

BACKGROUND

The present disclosure relates to a memory device, and more particularly to a memory device that can be used as an OTP (One-Time Programmable) memory and an MTP (Multi-Time Programmable) memory.

In general, a programmable memory is used in a mobile component, an MCU (Micro Controller Unit) used as a vehicle interior component, a power IC, a display driver IC, and a CMOS image sensor.

As such a programmable memory, an OTP (One-Time Programmable) memory may be used, which typically occupies a small area and may not need any additional process. The OTP memory typically has a thin gate oxide layer, and thus is programmed through electrical short by a breakdown mechanism when high voltage is applied thereto.

Further, in addition to the OTP memory that can be programmed only once, an MTP (Multi-Time Programmable) memory that can be repeatedly programmed is used.

SUMMARY

Certain aspects of the present inventive concept provide a hybrid memory device that can be used as an OTP memory or a MTP memory according to a designer's intention.

Additional advantages, objects, and features of the present disclosure will be set forth in part in the description which follows and in part will become apparent to those having ordinary skill in the art upon examination of the following or may be learned from practice of the present disclosure.

According to an aspect of the present inventive concept, a memory device includes nonvolatile memory cells, each of which comprises an active pattern including first to fourth regions successively arranged in one direction, a first gate structure crossing the active pattern on the second region and including a first gate electrode and a first insulating layer, and a second gate structure crossing the active pattern on the fourth region and including a second gate electrode and a second insulating layer, wherein the nonvolatile memory cell is configured such that a first voltage is applied to the second gate electrode when the second insulating layer is in a first state such that a current that passes through the second region becomes first current, the first voltage is applied to the second gate electrode when the second insulating layer is in a second state such that a current that passes through the second region becomes second current, the first voltage is applied to the second gate electrode when the second insulating layer is in a third state such that a current that passes through the second region becomes third current, the second current and the third current are higher than the first current, and the second current is different from the third current.

In some embodiments of the present inventive concept, in the case where the nonvolatile memory cell is used as an OTP (One-Time Programmable) cell, the first state is a state before the second insulating layer is programmed, and in the case where the nonvolatile memory cell is used as a MTP (Multi-Time Programmable) cell, the first state is a state before the second insulating layer is formed.

In some embodiments of the present inventive concept, in the case where the nonvolatile memory cell is used as an OTP cell, the second state is a state where the second insulating layer is programmed by a second voltage that is applied to the second gate electrode and is higher than the first voltage.

In some embodiments of the present inventive concept, the second insulating layer comprises an interface layer and a high-k dielectric layer that are successively formed on the active pattern, and the second state occurs by a breakdown at the interface layer in the second state.

In some embodiments of the present inventive concept, a data that is written in the nonvolatile memory cell is read using a ratio of the second current to the first current.

In some embodiments of the present inventive concept, in the case where the nonvolatile memory cell is used as a MTP cell, the second state is a state where the second insulating layer is set or formed by a second voltage that is applied to the second gate electrode and is higher than the first voltage, and the third state is a state where the second insulating layer is reset by a third voltage that is applied to the second gate electrode and is higher than the first voltage and is lower than the second voltage, and the second current is higher than the third current.

In some embodiments of the present inventive concept, the second insulating layer comprises an interface layer and a high-k dielectric layer that are successively formed on the active pattern, and a breakdown does not occur at the interface layer in the second state or the third state.

In some embodiments of the present inventive concept, a data that is written in the nonvolatile memory cell is read using a ratio of the second current to the third current.

In some embodiments of the present inventive concept, the memory device may further comprise an interlayer insulating layer including a first trench and a second trench and formed on the active pattern. The first insulating layer includes a first interface layer formed on a bottom surface of the first trench and a first high-k insulating layer formed on the first interface layer along side surfaces and the bottom surface of the first trench, and the second insulating layer includes a second interface layer formed on a bottom surface of the second trench and a second high-k insulating layer formed on the second interface layer along side surfaces and the bottom surface of the second trench.

In some embodiments of the present inventive concept, the first interface layer and the second interface layer comprise silicon oxide.

In some embodiments of the present inventive concept, the first high-k insulating layer and the second high-k insulating layer include the same material, and the first high-k insulating layer includes hafnium oxide (HfOx).

According to another aspect of the present inventive concept, a memory device includes nonvolatile memory cells, each of which comprises an active pattern including first to fourth regions successively arranged in one direction, a first gate structure crossing the active pattern on the second region and including a first gate electrode and a first insulating layer, and a second gate structure crossing the active pattern on the fourth region and including a second gate electrode and a second insulating layer, wherein the first region is connected to a sense amplifier that detects a current passing through the second region, in the case where the nonvolatile memory cell is an OTP (One-Time Programmable) cell before the second insulating layer is programmed or a MTP (Multi-Time Programmable) cell before the second insulating layer is formed, the second insulating layer has a first resistance value, in the case where the nonvolatile memory cell is used as the OTP cell, the second insulating layer has a second resistance value that is smaller than the first resistance value in the nonvolatile memory cell that is in a programmed state, and in the case where the nonvolatile memory cell is used as the MTP cell, the second insulating layer has a third resistance value that is smaller than the first resistance value and is larger than the second resistance value in the nonvolatile memory cell that is in a set state.

In some embodiments of the present inventive concept, the set state of a nonvolatile memory cell occurs when a first voltage is applied to the second gate electrode, a reset state of a nonvolatile memory cell occurs and the second insulating layer has a fourth resistance value greater than the third resistance value and smaller than the first resistance value, when a second voltage lower than the first voltage is applied to the second gate electrode.

In some embodiments of the present inventive concept, in the case where the nonvolatile memory cell is used as the MTP cell, the second insulating layer has a fourth resistance value smaller than the first resistance value and greater than the third resistance value of the nonvolatile memory cell that is in a reset state, when a read voltage is applied to the second gate electrode to read a data that is written in the nonvolatile memory cell, a current that flows through the second insulating layer having the first resistance value becomes a first current, a current that flows through the second insulating layer having the second resistance value becomes a second current, a current that flows through the second insulating layer having the third resistance value becomes a third current, and a current that flows through the second insulating layer having the fourth resistance value becomes a fourth current, and a ratio of the second current to the first current is higher than a ratio of the third current to the fourth current.

According to still another aspect of the present inventive concept, a memory device includes a row decoder configured to select a word line of a plurality of word lines; a column decoder configured to select a bit line of a plurality of bit lines; a first set of memory cells connected to corresponding word lines of the plurality of word lines and corresponding bit lines of the plurality of bit lines, each memory cell of the first set of memory cells having a first state and a second state opposite to the first state; and a second set of memory cells connected to corresponding word lines of the plurality of word lines and corresponding bit lines of the plurality of bit lines, each memory cell of the second set of memory cells having a third state and a fourth state opposite to the third state. A first memory cell of the first set of memory cells having a first resistance value has the first state and a second memory cell of the first set of memory cells having a second resistance value less than the first resistance value has the second state. A first memory cell of the second set of memory cells having a third resistance value less than the first resistance value and greater than the second resistance value has the third state, and a second memory cell of the second set of memory cells having a fourth resistance value less than the third resistance value and greater than the second resistance value has the fourth state.

BRIEF DESCRIPTION OF THE DRAWINGS

The above and other objects, features and advantages of the present inventive concept will be more apparent from the following detailed description taken in conjunction with the accompanying drawings, in which.

DETAILED DESCRIPTION OF THE EMBODIMENTS

Figure 1:
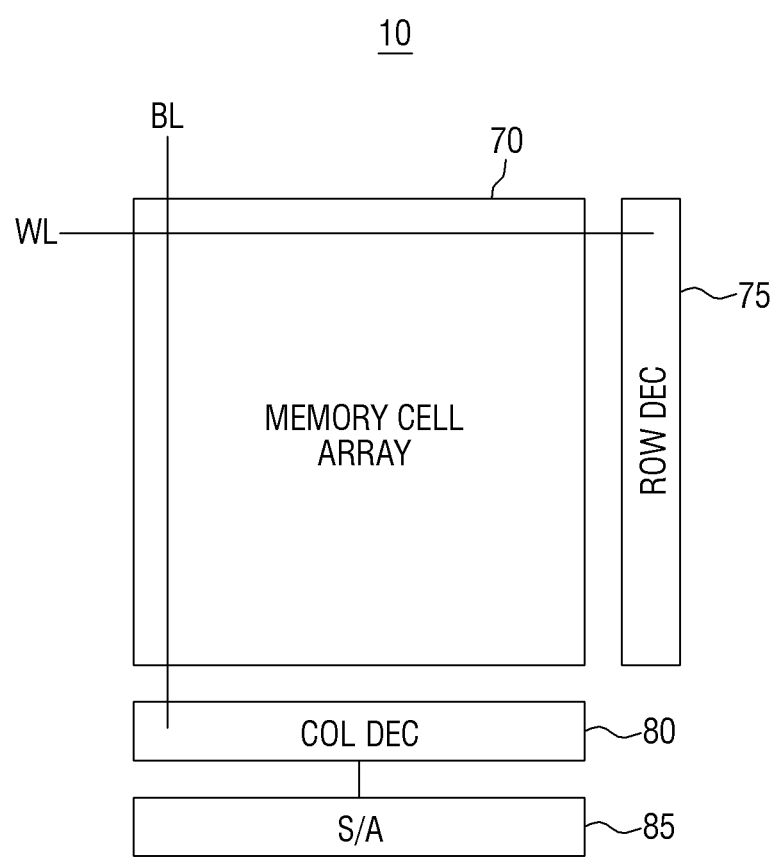
FIG. 1 is a conceptual diagram illustrating a memory device according to example embodiments of the present inventive concept.

Various aspects of the present inventive concept will now be described more fully hereinafter with reference to the accompanying drawings, in which example embodiments of the disclosure are shown. This inventive concept may, however, be embodied in different forms and should not be construed as limited to the embodiments set forth herein. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items. Expressions such as "at least one of," when preceding a list of elements, modify the entire list of elements and do not modify the individual elements of the list.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. Unless indicated otherwise, these terms are only used to distinguish one element from another element. For example, a first element, a first component or a first section discussed below could be termed a second element, a second component or a second section without departing from the teachings of the present disclosure.

The use of the terms "a" and "an" and "the" and similar referents in the context of describing the disclosure (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be further understood that the terms such as "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless the context indicates otherwise, terms such as "equal," "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless defined otherwise, all technical and scientific terms used herein have the same meaning as commonly understood by one of ordinary skill in the art to which this disclosure belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinafter, example embodiments of the present disclosure will be described with reference to the accompanying drawings.

Figure 2:
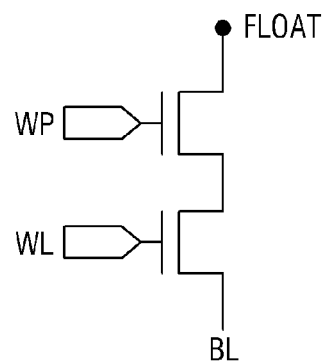
FIG. 2 is a circuit diagram of a nonvolatile memory cell of the memory device of FIG. 1 according to example embodiments.

FIG. 1 is a conceptual diagram illustrating a memory device according to example embodiments of the present inventive concept, and FIG. 2 is a circuit diagram of a nonvolatile memory cell of the memory device of FIG. 1 according to example embodiments. As used herein, a "memory device" may refer to a "volatile memory device" or a "nonvolatile memory device."

Referring to FIG. 1, a memory device 10 includes a memory cell array 70, a row decoder 75, a column decoder 80, and a sense amplifier 85.

The memory cell array 70 includes a plurality of nonvolatile memory cells positioned between X bit lines BL and Y word lines WL, respectively. Here, X and Y are integers that are equal to or larger than 1.

The row decoder 75 is connected to the word lines WL connected to the nonvolatile memory cells in the memory cell array 70. The row decoder 75 may decode row addresses (not shown) received from address buffers (not shown) and output a word line selecting signal to select a word line WL among the word lines WL.

The column decoder 80 is connected to the bit lines BL connected to the nonvolatile memory cells in the memory cell array 70. The column decoder 80 may decode column addresses (not shown) received from address buffers (not shown) and output a column selecting signal to select a bit line BL among the bit lines BL. The column decoder 80 may include a plurality of column selection transistors (not shown). Each of the column selection transistors may be connected to a bit line and the bit line may be selected in response to one of the column selection signals.

The sense amplifier 85 may be connected to the column select transistor of the column decoder 80 and sense and amplify the selected bit line signal.

A voltage generator (not shown) may generate a plurality of voltage signals having different voltage levels for programming, forming, setting, or resetting the nonvolatile memory cells based on an external power supply voltage VDD.

In example embodiments, the row decoder 75, the column decoder 80 and the sense amplifier 85 may operate based on the external power supply voltage VDD or an internal power supply voltage IVDD generated by the voltage generator.

In one embodiment, the memory device 10 may include an additional memory cell array (not shown), an additional row decoder (not shown), an additional column decoder (not shown) and an additional sense amplifier (not shown). The additional memory cell array may include a plurality of memory cells connected with word lines of the additional row decoder and bit lines corresponding to the additional column decoder. The additional memory cell array may include a plurality of volatile memory cells or a plurality of nonvolatile memory cells.

As illustrated in FIG. 2, each nonvolatile memory cell is connected between a bit line BL and a word line WL. The nonvolatile memory cell may include two transistors. A first transistor (e.g., an access transistor) is provided with a gate terminal that is connected to a word line WL, a source terminal that is connected to a drain terminal of a second transistor, and a drain terminal that is connected to a bit line BL. The second transistor (e.g., a rupture transistor) is provided with a gate terminal that is connected to a high-voltage line WP, a source terminal that is connected to a floating terminal FLOAT, and a drain terminal that is connected to the source terminal of the first transistor. For example, one of the voltage signals of the voltage generator of FIG. 1 may be provided on the high-voltage line WP.

Referring to FIGS. 3 to 9D, a nonvolatile memory cell according to an exemplary embodiment of the present inventive concept will be described.

Figure 3:
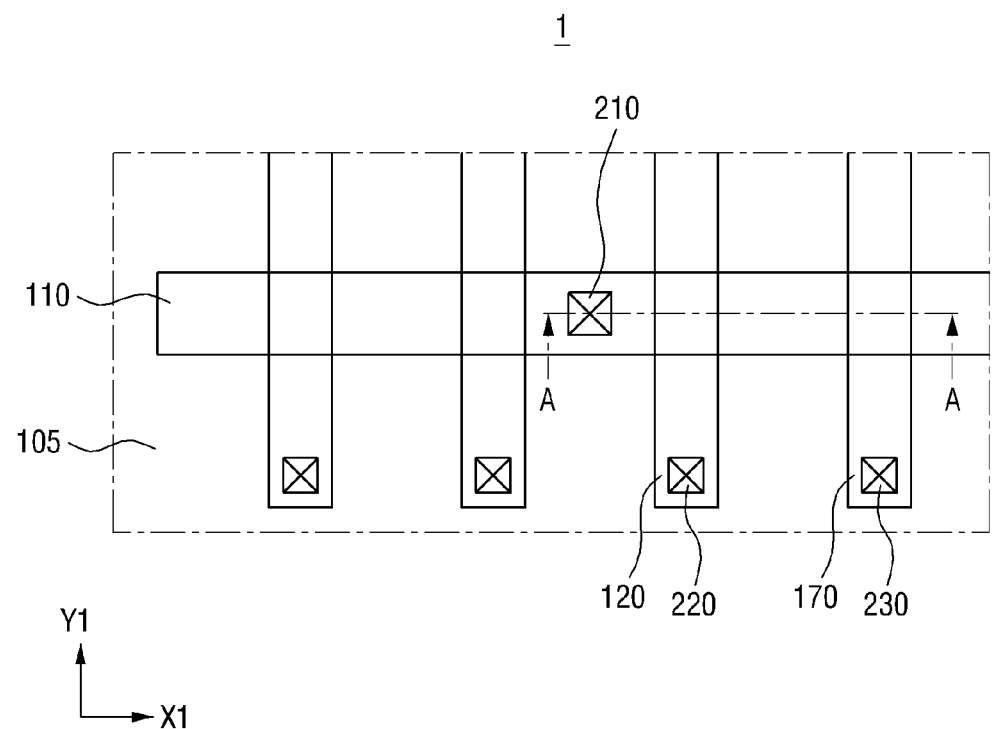
FIG. 3 is a layout diagram of nonvolatile memory cells included in the memory device of FIG. 1 according to an exemplary embodiment of the present inventive concept.
Figure 4:
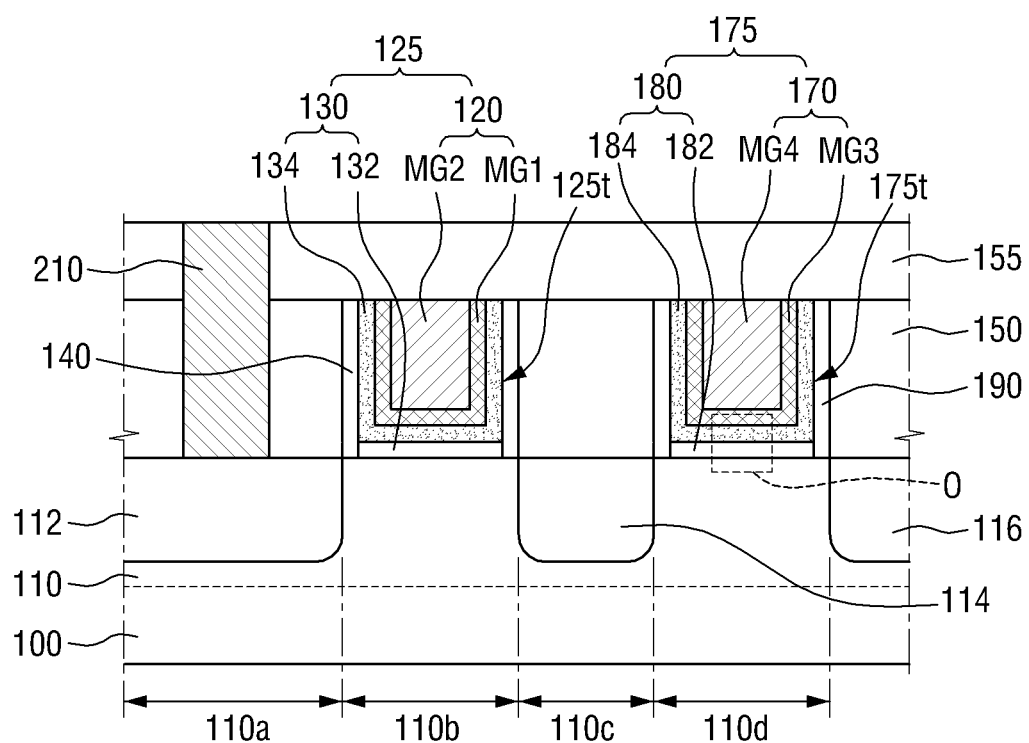
FIG. 4 is a cross-sectional view taken along line A-A of FIG. 3 according to example embodiments.
Figure 5A:
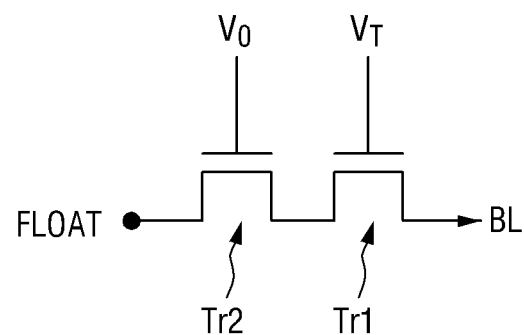
FIGS. 5A and 5B are views explaining a state of the nonvolatile memory cell before being programmed or formed according to example embodiments.
Figure 5B:
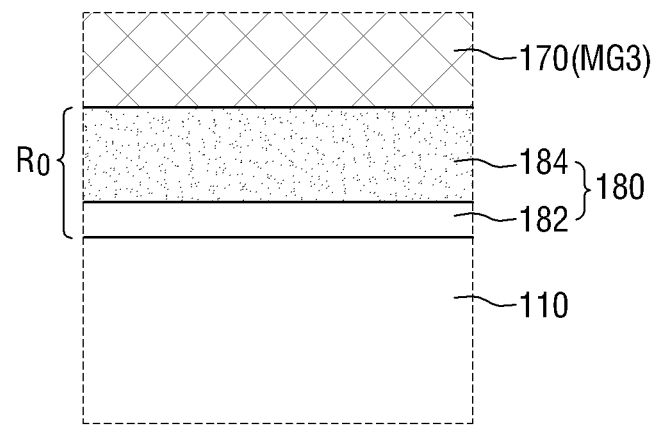
Figure 6A:
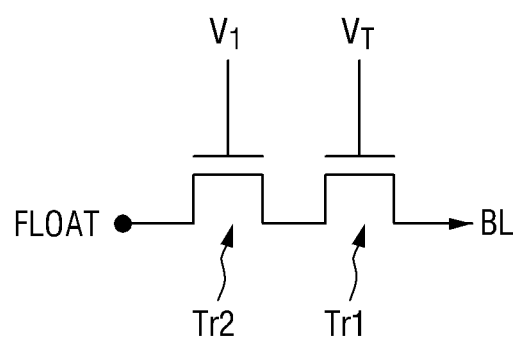
FIGS. 6A and 6B are views explaining a programmed state of the nonvolatile memory cell of FIG. 3 in a case where the nonvolatile memory cell is used as an OTP memory cell according to example embodiments.
Figure 6B:
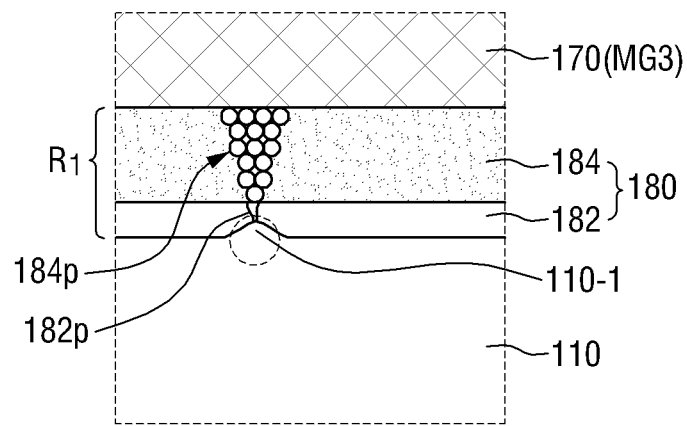
Figure 7A:
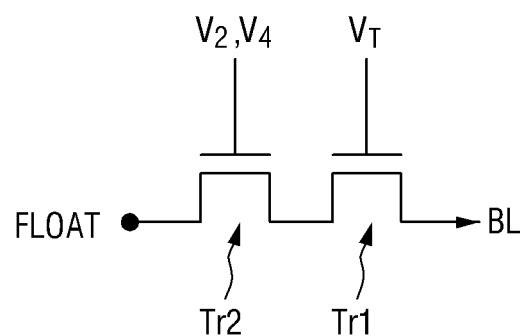
FIGS. 7A and 7B are views explaining a formed state or a set state of the nonvolatile memory cell of FIG. 3 in a case where the nonvolatile memory cell is used as a MTP memory cell according to example embodiments.
Figure 7B:
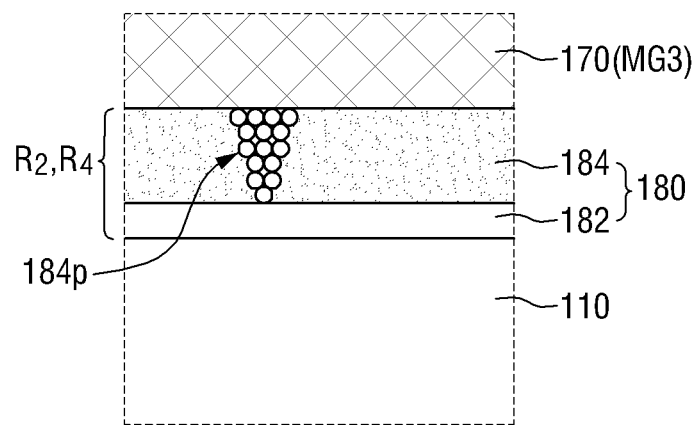
Figure 8A:
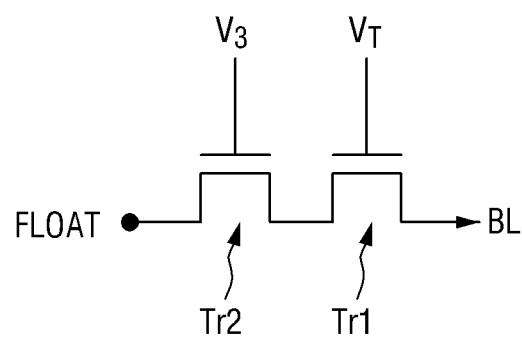
FIGS. 8A and 8B are views explaining a reset state of the nonvolatile memory cell of FIG. 3 in a case where the nonvolatile memory cell is used as a MTP memory cell according to example embodiments.
Figure 8B:
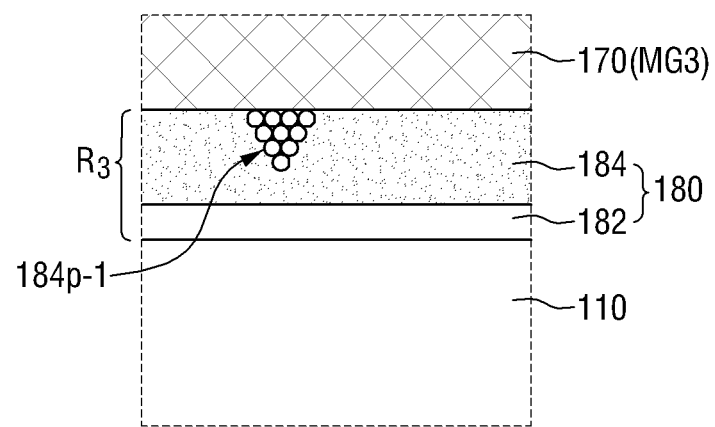

FIG. 3 is a layout diagram of nonvolatile memory cells included in the memory device 10 according to an exemplary embodiment of the present inventive concept, and FIG. 4 is a cross-sectional view taken along line A-A of FIG. 3 according to example embodiments. FIGS. 5A and 5B are views explaining a state of the nonvolatile memory cell before being programmed or formed according to example embodiments, and FIGS. 6A and 6B are views explaining a programmed state of the nonvolatile memory cell of FIG. 3 in a case where the nonvolatile memory cell is used as an OTP memory cell according to example embodiments. FIGS. 7A and 7B are views explaining a formed state or a set state of the nonvolatile memory cell of FIG. 3 in a case where the nonvolatile memory cell is used as a MTP memory cell according to example embodiments, and FIGS. 8A and 8B are views explaining a reset state of the nonvolatile memory cell of FIG. 3 in a case where the nonvolatile memory cell is used as a MTP memory cell according to example embodiments. FIGS. 9A to 9D are diagrams explaining changes of current and voltages when the nonvolatile memory cell of FIG. 3 is operated according to example embodiments.

In FIG. 3, for convenience in explanation, a first interlayer insulating layer 150 and a second interlayer insulating layer 155 are not illustrated.

Referring to FIGS. 3 and 4, a nonvolatile memory cell 1 according to an exemplary embodiment of the present inventive concept includes one or more nonvolatile memory cells.

The nonvolatile memory cell may include a first active pattern 110, a first gate structure 125, a second gate structure 175, and a first contact 210.

A substrate 100 may be made of bulk silicon or SOI (Silicon-On-Insulator). Unlike this, the substrate 100 may be a silicon substrate or may include another material, such as silicon germanium, indium antimonide, lead telluride, indium arsenide, indium phosphorus, gallium arsenide, or gallium antimonide. Further, the substrate 100 may be obtained by forming an epitaxial layer on a base substrate.

The first active pattern 110 may be a part of the substrate 100. The first active pattern 110 may be defined by a field insulating layer 105. The field insulating layer 105 may include, for example, one of an oxide layer, a nitride layer, an oxynitride layer, and a combination thereof.

The first active pattern 110 may extend along a first direction X1. The first active pattern 110 may include a first side that extends in the first direction X1 and a second side that extends in a second direction Y1.

The first active pattern 110 may include first to fourth regions 110a, 110b, 110c, and 110d. The first region 110a of the first active pattern 110, the second region 110b of the first active pattern 110, the third region 110c of the first active pattern 110, and the fourth region 110d of the first active pattern 110 may be successively arranged in the first direction X1.

The first to fourth regions 110a, 110b, 110c, and 110d of the first active pattern 110 may be directly connected to each other.

The first interlayer insulating layer 150 is formed on the substrate 100. The first interlayer insulating layer 150 covers the first active pattern 110 and the field insulating layer 105.

The first interlayer insulating layer 150 may include a first trench 125t and a second trench 175t that extend in the second direction Y1.

The first trench 125t may cross the second region 110b of the first active pattern 110, and the second trench 175t may cross at least a part of the fourth region 110d of the first active pattern 110. FIG. 4 illustrates that the second trench 175t entirely crosses the fourth region 110d of the first active pattern 110. However, this is merely for convenience in explanation, and the shape of the second trench 175t is not limited thereto.

The first interlayer insulating layer 150 may include, for example, at least one of a low-k material, an oxide layer, a nitride layer, and an oxynitride layer. The low-k material may be, for example, FOX (Flowable Oxide), TOSZ (Tonen SilaZen), USG (Undoped Silica Glass), BSG (Borosilica Glass), PSG (PhosphoSilaca Glass), PBSG (BoroPhosphoSilica Glass), PETEOS (Plasma Enhanced Tetra Ethyl Ortho Silicate), FSG (Fluoride Silicate Glass), HDP (High Density Plasma) oxide, PEOX (Plasma Enhanced Oxide), FCVD (Flowable CVD) oxide, or a combination thereof, but is not limited thereto.

The second interlayer insulating layer 155 is formed on the first interlayer insulating layer 150. The second interlayer insulating layer 155 may include, for example, at least one of a low-k material, an oxide layer, a nitride layer, and an oxynitride layer.

The first gate structure 125 may be formed in the first trench 125t. The first gate structure 125 is formed on the second region 110b of the first active pattern 110 to cross the first active pattern 110.

The first gate structure 125 may include a first gate electrode 120 and a first insulating layer 130. The first gate electrode 120 is formed on the second region 110b of the first active pattern 110 to cross the first active pattern 110. The first gate electrode 120 may extend in the second direction Y1.

The first gate electrode 120 may include metal layers MG1 and MG2. As illustrated, the first gate electrode 120 may be formed by laminating two or more metal layers MG1 and MG2, but is not limited thereto. The first metal layer MG1 may serve to adjust work function, and the second metal layer MG2 may serve to fill a space that is formed by the first metal layer MG1. For example, the first metal layer MG1 may include at least one of TiN, TaN, TiC, TiAl, and TaC. For example, the second metal layer MG2 may include W or Al. For example, the first gate electrode 120 may be made of Si, SiGe or poly-Si that is not metal. The first gate electrode 120 may be formed, for example, through a replacement process, but is not limited thereto.

In one embodiment, the first gate electrode 120 may be the gate terminal of the first transistor (e.g., an access transistor) illustrated in FIG. 2. For example, the first gate electrode 120 may be connected to the word line WL.

The first insulating layer 130 may be formed between the first active pattern 110 and the first gate electrode 120. The first insulating layer 130 may include a first interface layer 132 and a first high-k insulating layer 134. The first interface layer 132 and the first high-k insulating layer 134 are successively formed on the second region 110b of the first active pattern.

The first interface layer 132 may be formed on the bottom surface of the first trench 125t. For example, a part of the second region 110b of the first active pattern may be oxidized to form the first interface layer 132. The first interface layer 132 may include, for example, silicon oxide.

The first high-k insulating layer 134 may be formed on the first interface layer 132. The first high-k insulating layer 134 may be formed along the side wall (e.g., side surface) and the bottom surface of the first trench 125t.

The first high-k insulating layer 134 may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

In one embodiment, the first insulating layer 130 may be used as a gate insulating layer.

A first gate spacer 140 may be formed on side walls of the first gate electrode 120 that extends in the second direction Y1.

The first gate spacer 140 may include, for example, at least one of silicon nitride (SiN), silicon oxynitride (SiON), silicon oxide ($SiO_2$), silicon carbon oxynitride (SiOCN), and a combination thereof, but is not limited thereto. The first gate spacer 140 is illustrated as a single layer, but is not limited thereto. For example, the first gate spacer 140 may have a multilayer structure.

A second gate structure 175 may be formed inside the second trench 175t. The second gate structure 175 is formed on the fourth region 110d of the first active pattern 110 to cross the first active pattern 110.

The second gate structure 175 may include a second gate electrode 170 and a second insulating layer 180. The second gate electrode 170 is formed on the fourth region 110d of the first active pattern to cross the first active pattern 110. The second gate electrode 170 extends in the second direction Y1.

The second gate electrode 170 may include metal layers MG3 and MG4. As illustrated, the second gate electrode 170 may be formed by laminating two or more metal layers MG3 and MG4, but is not limited thereto. Since the explanation of the second gate electrode 170 may be identical to the explanation of the first gate electrode 120, and thus the duplicate explanation thereof will be omitted.

In one embodiment, the second gate electrode 170 may be the gate terminal of the second transistor (e.g., a rupture transistor) illustrated in FIG. 2. For example, the second gate electrode 170 may be connected to the high-voltage line WP.

The second insulating layer 180 may be formed between the first active pattern 110 and the second gate electrode 170. The second insulating layer 180 may include a second interface layer 182 and a second high-k insulating layer 184. The second interface layer 182 and the second high-k insulating layer 184 are successively formed on the fourth region 110d of the first active pattern 110.

The second interface layer 182 may be formed on the bottom surface of the second trench 175t. For example, a part of the fourth region 110d of the first active pattern 110 may be oxidized to form the second interface layer 182. The second interface layer 182 may include, for example, silicon oxide.

The second high-k insulating layer 184 may be formed on the second interface layer 182. The second high-k insulating layer 184 may be formed along the side wall and the bottom surface of the second trench 175t.

The second high-k insulating layer 184 may include, for example, at least one of hafnium oxide, zirconium oxide, and titanium oxide, hafnium silicon oxide, lanthanum oxide, lanthanum aluminum oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate, but is not limited thereto.

In one embodiment, the second insulating layer 180 may be used as an information storage portion of the nonvolatile memory cell.

In one embodiment, if the first high-k insulating layer 134 and the second high-k insulating layer 184 include the same material, they can be formed at the same level. Here, "the same level" means being formed in the same manufacturing process.

Further, in one embodiment, the first gate electrode 120 and the second gate electrode 170 may include the same material and may be formed at the same level.

The second gate spacer 190 may be formed on the side wall of the second gate electrode 170 that extends in the second direction Y1.

The second gate spacer 190 may include, for example, at least one of silicon nitride (SiN), silicon oxynitride (SiON), silicon oxide ($SiO_2$), silicon carbon oxynitride (SiOCN), and a combination thereof. The second gate spacer 190 is illustrated as a single layer, but is not limited thereto. For example, the second gate spacer 190 may have a multilayer structure.

A first impurity region 112 may be formed on the first region 110a of the first active pattern 110, and a second impurity region 114 may be formed on the third region 110c of the first active pattern 110.

A third impurity region 116 may be formed on an opposite side of the third region 110c of the first active pattern 110 centering around the second gate structure 175, but is not limited thereto. In the case where the second gate structure 175 is formed to cross a part of the fourth region 110d of the first active pattern 110, the third impurity region 116 may not be formed.

In one embodiment, the first impurity region 112, the second impurity region 114, and the third impurity region 116 may be formed in the first active pattern 110.

In one embodiment, if the first gate electrode 120 is a gate terminal of a PMOS transistor, the first to third impurity regions 112, 114, and 116 may include, for example, a p-type impurity. The p-type impurity may be, for example, boron (B), but is not limited thereto.

In one embodiment, if the first gate electrode 120 is a gate terminal of an NMOS transistor, the first to third impurity regions 112, 114, and 116, may include, for example, an n-type impurity. The n-type impurity may be, for example, phosphorus (P), arsenide (As), or antimony (Sb), but is not limited thereto.

The first contact 210 is formed on the first region 110a of the first active pattern 110. The first contact 210 may be formed to penetrate the first interlayer insulating layer 150 and the second interlayer insulating layer 155, but is not limited thereto.

The first contact 210 is electrically connected to the first region 110a of the first active pattern 110. More specifically, the first contact 210 is electrically connected to the first impurity region 112.

The second contact 220 is formed on the first gate electrode 120. The second contact 220 is electrically connected to the first gate electrode 120. For example, the first gate electrode 120 may be connected to the word line WL of FIG. 2 through the medium of the second contact 220.

A third contact 230 is formed on the second gate electrode 170. The third contact 230 is electrically connected to the second gate electrode 170. For example, the second gate electrode 170 may be connected to the high-voltage line WP of FIG. 2 through the medium of the third contact 230.

The first contact 210, the second contact 220, and the third contact 230 may include, for example, Al, Cu, and W, but are not limited thereto.

In one embodiment, the first impurity region 112 may be a drain terminal of the first transistor (e.g., an access transistor) illustrated in FIG. 2. For example, the first impurity region 112 may be connected to the bit line BL. Accordingly, the first impurity region 112 may be connected to the bit line BL through the medium of the first contact 210. Further, the first impurity region 112 may be electrically connected to the column decoder 80 and the sense amplifier 85 of FIG. 1 through the medium of the first contact 210.

In one embodiment, the second impurity region 114, which is shared by the first gate electrode 120 and the second gate electrode 170 may be a source terminal of the first transistor (e.g., an access transistor) and a drain terminal of the second transistor (e.g., a rupture transistor) as illustrated in FIG. 2.

As illustrated in FIG. 4, a contact that is electrically connected to the third region 110c of the first active pattern 110 on the third region 110c of the first active pattern 110 may be not formed. A contact that is electrically connected to the second impurity region 114 on the second impurity region 114 may be not formed. For example, the second impurity region 114 on the third region 110c of the first active pattern 110 may be not electrically connected to wire supplying voltage or current, wire used as electrical signal path, or the like.

FIG. 4 illustrates that a contact that is electrically connected to the third region 110c of the first active pattern is not formed, but is not limited thereto. Even if a contact that is electrically connected to the third region 110c of the first active pattern 110 is formed, the contact is not electrically connected to a wire or the like.

Hereinafter, the state of the second insulating layer 180, the resistance of the second insulating layer 180, and the like will be described in the case where the nonvolatile memory cells included in the memory device 10 of the present disclosure are used as the OTP memory cells or the MTP memory cells. Further, current and the like that passes through a channel region of the first transistor of FIG. 2, that is, the second region 110b of the first active pattern 110 of FIG. 4, will be described.

For reference, each of FIGS. 5A, 6A, 7A, 8A, and 9A schematically illustrates a circuit of a nonvolatile memory cell. In FIGS. 5A, 6A, 7A, 8A, and 9A, a third transistor Tr1 may correspond to the first transistor (e.g., an access transistor) of FIG. 2, and a fourth transistor Tr2 may correspond to the second transistor (e.g., a rupture transistor) of FIG. 2. FIGS. 5B, 6B, 7B, and 8B are schematic diagrams explaining states of the second insulating layer 180 (e.g., a portion "O" of FIG. 4) included in the nonvolatile memory cell. FIG. 9B illustrates on/off current in the case where the nonvolatile memory cell is used as the OTP memory cell. FIG. 9C illustrates on/off current in the case where the nonvolatile memory cell is used as the MTP memory cell. FIG. 9D illustrates changes of resistances of the respective second insulating layer 180 in the case where the nonvolatile memory cell is used as the OTP memory cell and the MTP memory cell.

FIGS. 5A and 5B illustrate the state of the second insulating layer 180 when the nonvolatile memory cell is not programmed. Further, FIGS. 5A and 5B illustrate the state of the second insulating layer 180 when the nonvolatile memory cell is not formed (as used herein "forming" a memory cell refers to causing an insulating layer (such as insulating layer 180) to have a configuration that allows a memory cell to function as an MTP cell).

A first voltage $V_0$ may be applied to a gate terminal of the fourth transistor Tr2 of the nonvolatile memory cell, and a first threshold voltage $V_T$ may be applied to a gate terminal of the third transistor Tr1.

The first voltage $V_0$ that is applied to the gate terminal of the fourth transistor Tr2 may have a voltage level that is unable to program or form the nonvolatile memory cell. In one embodiment, a voltage level of the first voltage $V_0$ may be equal to the VDD or the IVDD, or greater than VDD or IVDD. In one embodiment, a voltage level of the first threshold voltage $V_T$ may be equal to VDD or IVDD, or greater than VDD or IVDD. In one embodiment, the voltage level of the first threshold voltage $V_T$ may be equal to or greater than the voltage level of the first voltage $V_0$.

Accordingly, the second insulating layer 180 included in the fourth transistor Tr2 may be not damaged. For example, when the nonvolatile memory cell is not programmed or formed, the second insulating layer 180 may be in a first state having a first resistance value $R_0$.

For example, in the case where the nonvolatile memory cell is used as the OTP memory cell, the second insulating layer 180 that is in the first state having the first resistance value $R_0$ may be in a state before being programmed. For another example, in the case where the nonvolatile memory cell is used as the MTP memory cell, the second insulating layer 180 that is in the first state having the first resistance $R_0$ may be in a state before being formed.

FIGS. 6A and 6B illustrate the state of the nonvolatile memory cell in the case where the nonvolatile memory cell is used as the OTP memory cell. More specifically, FIGS. 6A and 6B illustrate the state where the nonvolatile memory cell that is used as the OTP memory cell is programmed.

A second voltage $V_1$ may be applied to the gate terminal of the fourth transistor Tr2 of the nonvolatile memory cell, and the first threshold voltage $V_T$ may be applied to the gate terminal of the third transistor Tr1.

The second voltage $V_1$ that is applied to the gate terminal of the fourth transistor Tr2 may have a voltage level that is able to program or form the nonvolatile memory cell. The second voltage $V_1$ for programming the nonvolatile memory cell so as to use the nonvolatile memory cell as the OTP memory cell is higher than the first voltage $V_0$. In one embodiment, a voltage level of the second voltage $V_1$ may be 4 VDD~9 VDD or 4 IVDD~9 IVDD and greater than a voltage level of the first threshold voltage $V_T$.

As the second voltage $V_1$ that is a programming voltage is applied to the gate terminal of the fourth transistor Tr2, the second insulating layer 180 included in the fourth transistor Tr2 may be damaged. More specifically, in the nonvolatile memory cell that is programmed by the second voltage $V_1$ so as to be used as the OTP memory cell, a breakdown may occur in the second interface layer 182. For example, a crack 182p, which occurs due to a breakdown, may be formed in the second interface layer 182.

In addition, as the breakdown occurs in the second interface layer 182, a DBIE (Dielectric Breakdown Induced Epitaxy) region 110-1 may be formed on the first active pattern 110. Since the DBIE region 110-1 may be formed in a boundary portion between the first active pattern 110 and the second interface layer 182, it may be formed in the fourth region 110d of the first active pattern 110.

Further, in the second high-k insulating layer 184, a first filament 184p that can be used as a current path (or, a conduction path) may be formed. The first filament 184p may be formed between the second gate electrode 170 and the second interface layer 182 to be used as a current path.

The first filament 184p may be formed, for example, by a movement of oxygen vacancy included in the second high-k insulating layer 184. The first filament 184p illustrated in FIG. 6B is in an abstract shape for explanation, but is not limited thereto.

Accordingly, when the nonvolatile memory cell is programmed using the second voltage $V_1$, the second insulating layer 180 may be in a second state having a second resistance value $R_1$.

For example, in the case where the nonvolatile memory cell is used as the OTP cell, the second insulating layer 180 that is in the second state having the second resistance value $R_1$ may be in a programmed state. In one example, once the OTP cell is in a program state the state does not change to any different state.

As explained later using FIG. 9D, the second resistance value $R_1$ that the second insulating layer 180 in the second state has is smaller than the first resistance value $R_0$ that the second insulating layer 180 in the first state has.

FIGS. 7A and 7B illustrate the state of the nonvolatile memory cell in the case where the nonvolatile memory cell is used as the MTP memory cell. More specifically, FIGS. 7A and 7B illustrate the state where the nonvolatile memory cell that is used as the MTP memory cell is formed or set.

First, in order to use the nonvolatile memory cell as the MTP memory cell, the case where the nonvolatile memory cell is formed will be described.

A third voltage $V_2$ may be applied to the gate terminal of the fourth transistor Tr2 of the nonvolatile memory cell, and the first threshold voltage $V_T$ may be applied to the gate terminal of the third transistor Tr1.

The third voltage $V_2$ that is applied to the gate terminal of the fourth transistor Tr2 may have a voltage level that is able to form the nonvolatile memory cell. The third voltage $V_2$ for forming the nonvolatile memory cell so as to use the nonvolatile memory cell as the MTP memory cell is higher than the first voltage $V_0$. However, the third voltage $V_2$ for forming the nonvolatile memory cell may be lower than the second voltage $V_1$ for programming the nonvolatile memory cell so as to use the nonvolatile memory cell as the OTP memory cell. In one embodiment, a voltage level of the third voltage $V_2$ may be 4 VDD~7 VDD or 4 IVDD~7 IVDD and greater than a voltage level of the first threshold voltage $V_T$.

In one embodiment, in order to use the nonvolatile memory cell as the MTP memory cell, the third voltage $V_2$ that is a forming voltage is applied to the gate terminal of the fourth transistor Tr2, and in this case, the second insulating layer 180 included in the fourth transistor Tr2 may be damaged. More specifically, in the second high-k insulating layer 184, the first filament 184p that can be used as a current path may be formed.

For example, in the nonvolatile memory cell that is formed by the third voltage $V_2$ so as to be used as the MTP memory cell, a breakdown does not occur in the second interface layer 182. For example, a crack, which may occur due to the breakdown, may be not formed.

This is because the third voltage $V_2$ that is applied to the gate terminal of the fourth transistor Tr2 so as to use the nonvolatile memory cell as the MPT memory cell may be lower than the second voltage $V_1$ that is applied to the gate terminal of the fourth transistor Tr2 so as to use the nonvolatile memory cell as the OPT memory cell.

Accordingly, when the nonvolatile memory cell is formed using the third voltage $V_2$, the second insulating layer 180 may be in a third state having a third resistance value $R_2$.

In one embodiment, in the case where the nonvolatile memory cell is used as the MTP memory cell, the second insulating layer 180 that is in the third state having the third resistance value $R_2$ may be in a formed state.

Next, in the case where the nonvolatile memory cell is used as the MTP memory cell, the case where the nonvolatile memory cell is set will be described.

A fifth voltage $V_4$ may be applied to the gate terminal of the fourth transistor Tr2 of the nonvolatile memory cell, and the first threshold voltage $V_T$ may be applied to the gate terminal of the third transistor Tr1.

The fifth voltage $V_4$ that is applied to the gate terminal of the fourth transistor Tr2 may be a voltage that is able to set the nonvolatile memory cell. The fifth voltage $V_4$ for setting the nonvolatile memory cell so as to use the nonvolatile memory cell as the MTP memory cell is higher than the first voltage $V_0$. However, the fifth voltage $V_4$ for setting the nonvolatile memory cell may be lower than the second voltage $V_1$ for programming the nonvolatile memory cell so as to use the nonvolatile memory cell as the OTP memory cell.

In the case where the nonvolatile memory cell is used as the MTP memory cell, the fifth voltage $V_4$ that is a set voltage is applied to the gate terminal of the fourth transistor Tr2, and in this case, the first filament 184p that can be used as a current path may be formed in the second high-k insulating layer 184. In one embodiment, a voltage level of the fifth voltage $V_4$ may be 4 VDD~7 VDD or 4 IVDD~7 IVDD and greater than a voltage level of the first threshold voltage $V_T$.

For example, in the case where the nonvolatile memory cell that is set by the fifth voltage $V_4$ is used as the MTP memory cell, a breakdown does not occur in the second interface layer 182.

Accordingly, when the nonvolatile memory cell is set using the fifth voltage $V_4$, the second insulating layer 180 may be in a fifth state having a fifth resistance value $R_4$.

In one embodiment, in the case where the nonvolatile memory cell is used as the MTP memory cell, the second insulating layer 180 that is in the fifth state having the fifth resistance value $R_4$ may be in a set state.

As explained later using FIG. 9D, the third resistance value $R_2$ that the second insulating layer 180 in the third state has, or the fifth resistance value $R_4$ that the second insulating layer 180 in the fifth state has is smaller than the first resistance value $R_0$ that the second insulating layer 180 in the first state has, but may be larger than the second resistance value $R_1$ that the second insulating layer 180 in the second state has.

FIGS. 8A and 8B illustrate the state of the nonvolatile memory cell in the case where the nonvolatile memory cell is used as the MTP memory cell. More specifically, FIGS. 8A and 8B illustrate the state where the nonvolatile memory cell that is used as the MTP memory cell is reset.

A fourth voltage $V_3$ may be applied to the gate terminal of the fourth transistor Tr2 of the nonvolatile memory cell, and the first threshold voltage $V_T$ may be applied to the gate terminal of the third transistor Tr1.

The fourth voltage $V_3$ that is applied to the gate terminal of the fourth transistor Tr2 may be a voltage that is able to reset the nonvolatile memory cell that is formed or set. In the case where the nonvolatile memory cell is used as the MTP memory cell, the fourth voltage $V_3$ for resetting the nonvolatile memory cell may be lower than the second voltage $V_1$ and the third voltage $V_2$. In one embodiment, a voltage level of the fourth voltage $V_3$ may be 4 VDD~7 VDD or 4 IVDD~7 IVDD and greater than a voltage level of the first threshold voltage $V_T$.

In the case where the nonvolatile memory cell is used as the MTP memory cell, the reset voltage is applied to the gate terminal of the fourth transistor Tr2 as the third voltage $V_2$, and thus a second filament 184p-1 that can be used as a current path may be formed in the second high-k insulating layer 184.

Unlike the first filament 184p that is formed in the second high-k insulating layer 184 in the formed or set state, the second filament 184p-1 that is formed in the second high-k insulating layer 184 in the reset state is not formed to entirely penetrate the second high-k insulating layer 184.

When the nonvolatile memory cell is reset using the fourth voltage $V_3$, the second insulating layer 180 may be in a fourth state having the fourth resistance value $R_3$.

In one embodiment, in the case where the nonvolatile memory cell is used as the MTP memory cell, the second insulating layer 180 that is in the fourth state having the fourth resistance value $R_3$ may be in a reset state.

In the case where the nonvolatile memory cell is used as the MTP cell, the fourth resistance value $R_3$ that the second insulating layer 180 in a reset state has is larger than the third resistance value $R_2$ that the second insulating layer 180 in a formed state has and the fifth resistance value $R_4$ that the second insulating layer 180 in a set state has. For example, the fourth resistance value $R_3$ that the second insulating layer 180 in a reset state has may be smaller than the first resistance value $R_0$ that the second insulating layer 180 in the first state has.

In one embodiment, the set state and the reset state of the MTP cell may be changeable with each other. For example, the MTP cell may change to have the fifth resistance value $R_4$ from the MTP cell having the fourth resistance value $R_3$ by applying the fifth voltage $V_4$ to the gate terminal of the MTP cell. Also, the MTP cell may change to have the fourth resistance value $R_3$ from the MTP cell having the fifth resistance value $R_4$ by applying the fourth voltage $V_3$ to the gate terminal of the MTP cell.

Whether to use the nonvolatile memory cell of the present disclosure as the OTP memory cell or the MTP memory cell may be determined by a selection (e.g., by a designer). In one embodiment, even if a plurality of nonvolatile memory cells are connected to one word line as shown in FIGS. 1 and 2, the nonvolatile memory cells connected to the one word line may be partially used as the OTP memory cells and the remaining nonvolatile memory cells may be used as the MTP memory cells. In one embodiment, OTP memory cells are connected to a first word line and MTP memory cells are connected to a second word line different from the first word line.

A high-voltage line that is used to program the nonvolatile memory cell so as to use the nonvolatile memory cell as the OTP memory cell and a high-voltage line that is used to form the nonvolatile memory cell so as to use the nonvolatile memory cell as the MTP memory cell may be composed of the same wire. For example, when the voltage that is applied to the high-voltage line is changed, the nonvolatile memory cell may become the OTP memory cell or may become the MTP memory cell.

Figure 9A:
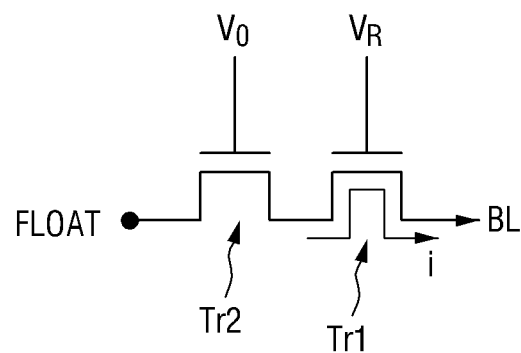
FIGS. 9A to 9D are diagrams explaining changes of current and voltages when the nonvolatile memory cell of FIG. 3 is operated according to example embodiments.
Figure 9B:
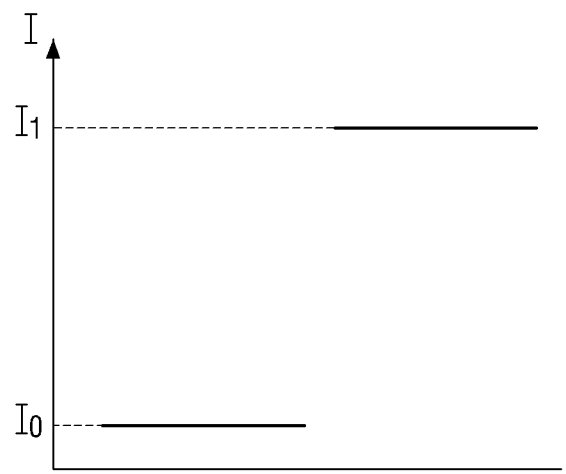
Figure 9C:
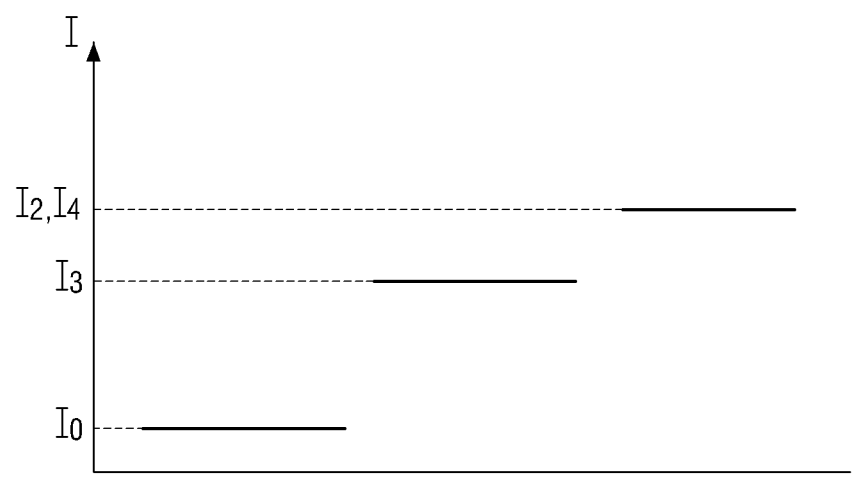
Figure 9D:
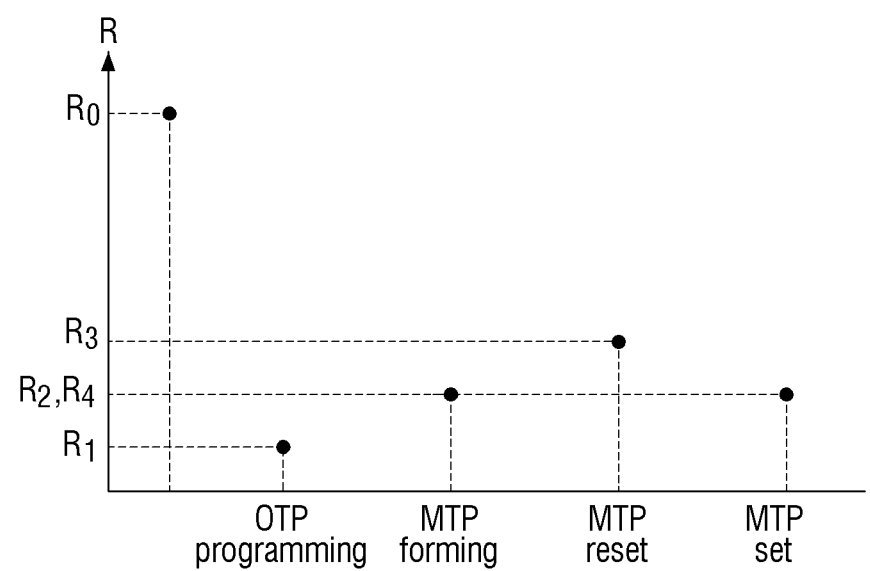

In FIG. 9A, in order to read data that is written in the nonvolatile memory cell after a forming process or set/reset process is performed to use the nonvolatile memory cell as the MTP memory cell, or after a programming process is performed to use the nonvolatile memory cell as the OTP memory cell, a second threshold voltage $V_R$ may be applied to the gate terminal of the third transistor Tr1, and the first voltage $V_0$ may be applied to the gate terminal of the fourth transistor Tr2. The second threshold voltage $V_R$ is a read voltage for reading the data written in the nonvolatile memory cell.

When the second threshold voltage $V_R$ is applied to the gate terminal of the third transistor Tr1 and the first voltage $V_0$ is applied to the gate terminal of the fourth transistor Tr2, current i flows through the channel region of the third transistor Tr1. The current i that flows through the channel region of the third transistor Tr1 flows to the bit line BL that is connected to the drain terminal of the third transistor Tr1 (the first region 110a of the first active pattern of FIG. 4). The current i that flows to the bit line BL is sensed by the sense amplifier 85 of FIG. 1.

The channel region of the third transistor Tr1 may correspond to the second region 110b of the first active pattern 110 as described above with reference to FIG. 4.

For convenience in explanation, it is described that the first voltage $V_0$ that is applied to the gate terminal of the fourth transistor Tr2 is the same as the voltage as described above with reference to FIGS. 5A and 5B, but is not limited thereto.

FIG. 9B shows currents that flow through the channel region of the third transistor Tr1 in the case where the nonvolatile memory cell is used as the OTP memory cell.

Referring to FIGS. 9B and 9D, a current that passes through the channel region of the third transistor Tr1 of the nonvolatile memory cell that is not programmed may be a first current $I_0$. Further, a current that passes through the channel region of the third transistor Tr1 of the nonvolatile memory cell that is programmed may be a second current $I_1$.

The second insulating layer 180 that is in the first state before being programmed may have the first resistance value $R_0$, and the second insulating layer 180 that is in the second state after being programmed may have the second resistance value $R_1$. Since the first resistance value $R_0$ of the second insulating layer 180 that is in the first state is larger than the second resistance value $R_1$ of the second insulating layer 180 that is in the second state, the second current $I_1$ is higher than the first current $I_0$.

In one embodiment, data that is written in the nonvolatile memory cell may be determined as a ratio of the second current $I_1$ to the first current $I_0$. In another embodiment, data that is written in the nonvolatile memory cell may be determined as a comparison of the second current $I_1$ or the first current $I_0$ to a reference current value. In still another embodiment, data that is written in the nonvolatile memory cell may be determined by using the first current $I_0$ or the second current $I_1$.

FIG. 9C shows currents that flow through the channel region of the third transistor Tr1 in the case where the nonvolatile memory cell is used as the MTP memory cell.

Referring to FIGS. 9C and 9D, a current that passes through the channel region of the third transistor Tr1 of the nonvolatile memory cell that is not formed may be the first current ($I_0$. A current that passes through the channel of the third transistor Tr1 of the nonvolatile memory cell that is formed may be a third current $I_2$, and a current that passes through the channel of the third transistor Tr1 of the nonvolatile memory cell that is set may be a fifth current $I_4$. Further, a current that passes through the channel of the third transistor Tr1 of the nonvolatile memory cell that is reset may be a fourth current $I_3$.

The second insulating layer 180 that is in the first state before being formed has the first resistance value $R_0$, and the second insulating layer 180 that is in the third state after being formed has the third resistance value $R_2$. Further, the second insulating layer 180 that is in the fourth state where the nonvolatile memory cell is reset has the fourth resistance value $R_3$, and the second insulating layer 180 that is in the fifth state where the nonvolatile memory cell is set has the fifth resistance value $R_4$.

The first resistance value $R_0$ of the second insulating layer 180 that is in the first state is larger than the fourth resistance value $R_3$ of the second insulating layer 180 that is in the fourth state, and the fourth resistance value $R_3$ of the second insulating layer 180 that is in the fourth state is larger than the third resistance value $R_2$ of the second insulating layer 180 that is in the third state and the fifth resistance value $R_4$ of the second insulating layer 180 that is in the fifth state.

Accordingly, the fourth current $I_3$ is higher than the first current $I_0$, and is lower than the third current $I_2$ and the fifth current $I_4$.

In one embodiment, data that is written in the nonvolatile memory cell may be determined as a ratio of the third current $I_2$ to the fourth current $I_3$. In another embodiment, data that is written in the nonvolatile memory cell may be determined by comparing the third current $I_2$ or the fourth current $I_3$ to a reference current value. In still another embodiment, data that is written in the nonvolatile memory cell may be determined by using the third current $I_2$ or the fourth current $I_3$.

Figure 10:
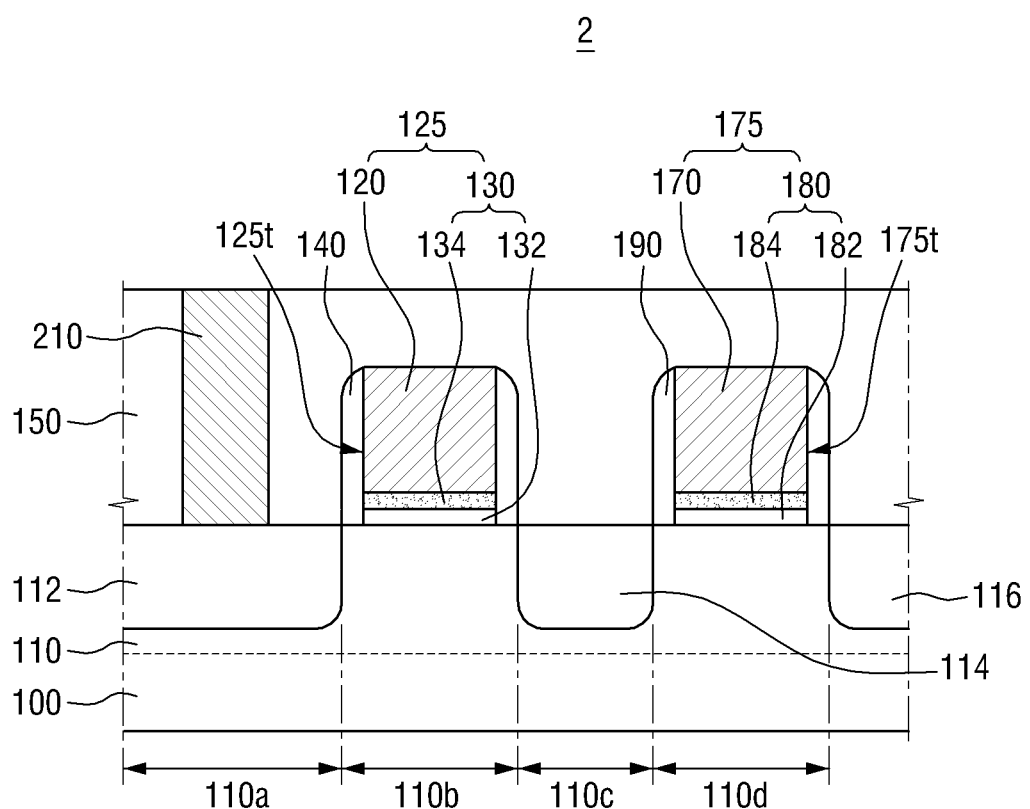
FIG. 10 is a cross-sectional view explaining a nonvolatile memory cell according to another exemplary embodiment of the present inventive concept.

FIG. 10 is a cross-sectional view explaining a nonvolatile memory cell 2 according to another example embodiment of the present inventive concept. For reference, FIG. 10 is a cross-sectional view taken along line A-A of FIG. 3. For convenience in explanation, the following description will mainly discuss different points from those as described above using FIGS. 3 to 9D.

Referring to FIG. 10, a first high-k insulating layer 134 and a second high-k insulating layer 184 are formed along bottom surfaces of a first trench 125*t* and a second trench 175*t*.

For example, the first high-k insulating layer 134 and the second high-k insulating layer 184 are not formed along side walls of the first trench 125*t* and the second trench 175*t*.

FIG. 10 illustrates that a first gate electrode 120 and a second gate electrode 170 are single layers. However, this is for convenience in explanation, and the first gate electrode 120 and the second gate electrode 170 are not limited thereto.

The first gate electrode 120 and the second gate electrode 170 may include at least one of, for example, TiN, TaN, TiC, TaC, TiAl, W, and Al.

Figure 11:
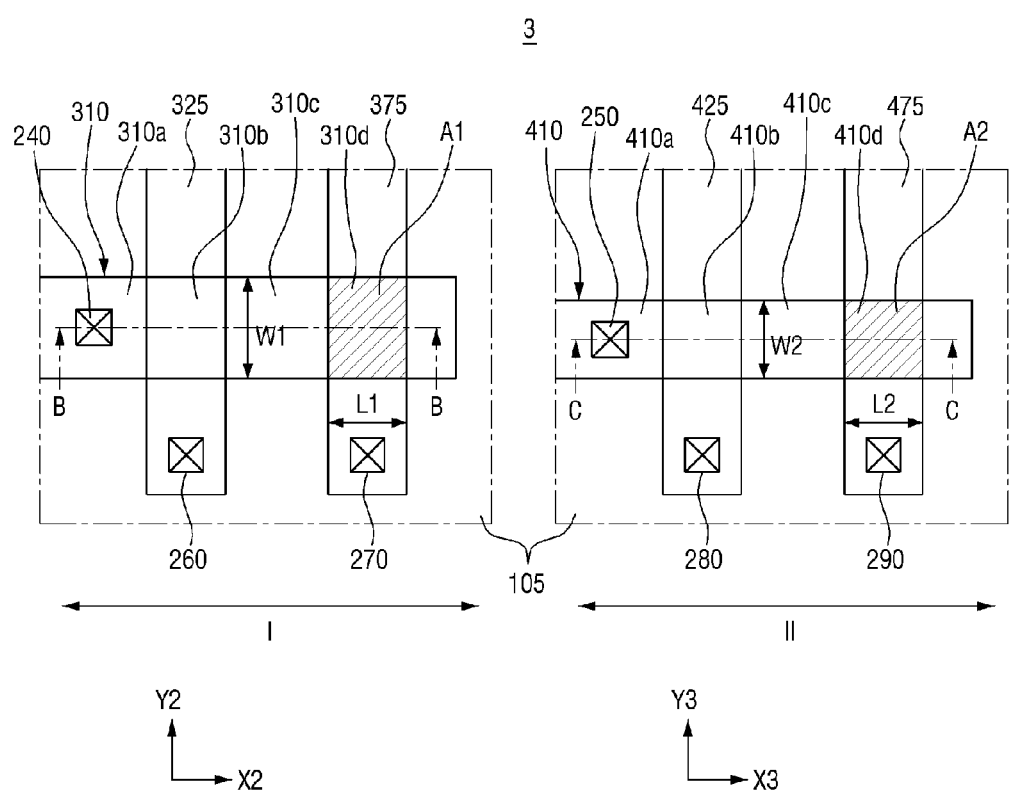
FIG. 11 is a layout diagram of nonvolatile memory cells included in a memory device according to still another exemplary embodiment of the present inventive concept.

FIG. 11 is a layout diagram of nonvolatile memory cells included in a memory device according to still another example embodiment of the present inventive concept.

Since cross-sectional views taken along line B-B and line C-C of FIG. 11 are similar to those illustrated in FIG. 4, the explanation thereof will be omitted.

Referring to FIG. 11, the memory device including the nonvolatile memory cells 3 may include a substrate 100 including a first region I and a second region II.

The first region I may be a region in which a nonvolatile memory cell that is to be used as an OTP memory cell is formed, and the second region II may be a region in which a nonvolatile memory cell that is to be used as an MTP memory cell is formed.

The nonvolatile memory cells 3 may include a first nonvolatile memory cell that is formed in the first region I and a second nonvolatile memory cell that is formed in the second region II.

The first nonvolatile memory cell may include a second active pattern 310, a third gate structure 325, a fourth gate structure 375, and a fourth contact 240.

The second nonvolatile memory cell may include a third active pattern 410, a fifth gate structure 425, a sixth gate structure 475, and a fifth contact 250.

The second active pattern 310 and the third active pattern 410 may be defined by a field insulating layer 105.

The second active pattern 310 may extend long along a third direction X2. The second active pattern 310 may include first to fourth regions 310*a*, 310*b*, 310*c*, and 310*d*. The first region 310*a* of the second active pattern 310, the second region 310*b* of the second active pattern 310, the third region 310*c* of the second active pattern 310, and the fourth region 310*d* of the second active pattern 310 may be successively arranged in the third direction X2.

The third gate structure 325 may extend in a fourth direction Y2. The third gate structure 325 is formed on the second region 310*b* of the second active pattern 310 to cross the second active pattern 310.

The fourth gate structure 375 may extend in the fourth direction Y2. The fourth gate structure 375 is formed on the fourth region 310*d* of the second active pattern 310 to cross the second active pattern 310.

The fourth contact 240 is formed on the first region 310*a* of the second active pattern 310.

The third active pattern 410 may extend long along a fifth direction X3. The third active pattern 410 may include first to fourth regions 410*a*, 410*b*, 410*c*, and 410*d*. The first region 410*a* of the third active pattern 410, the second region 410*b* of the third active pattern 410, the third region 410*c* of the third active pattern 410, and the fourth region 410*d* of the third active pattern 410 may be successively arranged in the fifth direction X3.

The fifth gate structure 425 may extend in a sixth direction Y3. The fifth gate structure 425 is formed on the second region 410*b* of the third active pattern 410 to cross the third active pattern 410.

The sixth gate structure 475 may extend in the sixth direction Y3. The sixth gate structure 475 is formed on the fourth region 410*d* of the third active pattern 410 to cross the third active pattern 410.

The fifth contact 250 is formed on the first region 410*a* of the third active pattern 410.

Since explanation of the third gate structure 325 and the fifth gate structure 425 is similar to the explanation of the first gate structure 125 of FIG. 4, and explanation of the fourth gate structure 375 and the sixth gate structure 475 is similar to the explanation of the second gate structure 175 of FIG. 4, the explanation thereof will be omitted.

Further, since explanation of the fourth contact 240 and the fifth contact 250 is similar to the explanation of the first contact 210 of FIG. 4, the explanation thereof will be omitted.

In one embodiment, the third to sixth gate structures 325, 375, 425, and 475 may include the same high-k material and a replacement metal gate electrode including the same metal material.

In one embodiment, a width W1 of a first portion A1 in which the second active pattern 310 and the fourth gate structure 375 overlap each other may be different from a width W2 of a second portion A2 in which the third active pattern 410 and the sixth gate structure 475 overlap each other. A length L1 of a first portion A1 in which the second active pattern 310 and the fourth gate structure 375 overlap each other may be the same as a length L2 of a second portion A2 in which the third active pattern 410 and the sixth gate structure 475 overlap each other. In one embodiment, an area of the first portion A1 may be greater than an area of the second portion A2. The width/length of each of the first and second portions A1 and A2 are extended in the direction Y2 and Y3/X2 and X3, respectively. For example, in a first nonvolatile memory cell that is used as the OTP memory cell, the width of the first region A1 which is a portion related to programming in the first nonvolatile memory cell that is used as the OTP memory cell is different from the width of the second region A2 which is a portion related to forming in the second nonvolatile memory cell that is used as the MTP memory cell.

More specifically, the width of the first region A1 in which the second active pattern 3109 and the fourth gate structure 375 overlap each other is wider than the width of the second region A2 in which the third active pattern 410 and the sixth gate structure 475 overlap each other.

Figure 12:
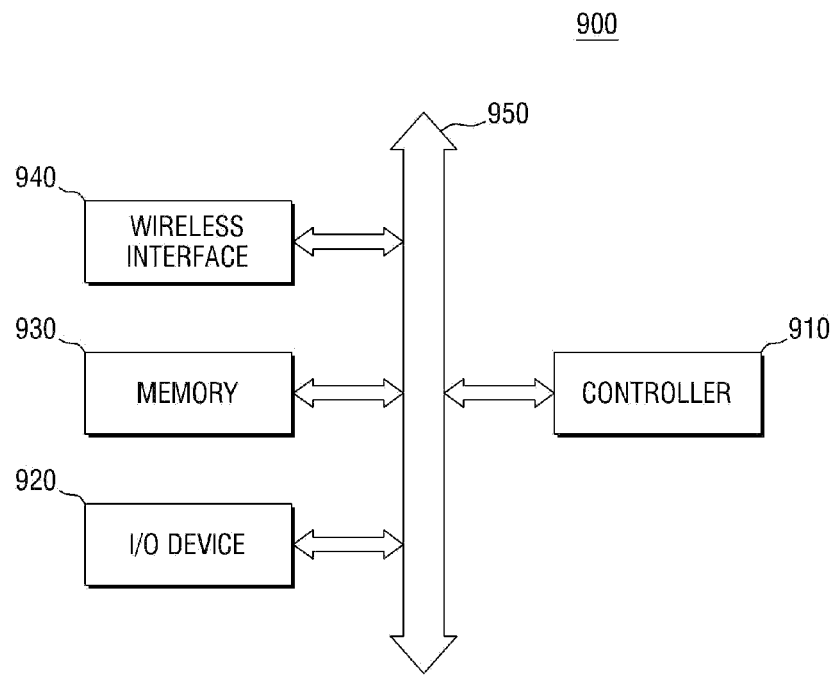
FIG. 12 is a block diagram schematically illustrating the configuration of a system including a memory device according to certain embodiments of the present inventive concept.

FIG. 12 is a block diagram schematically illustrating a system including a memory device according to certain embodiments of the present inventive concept.

Referring to FIG. 12, a system 900 may be used in wireless communication devices, for example, a PDA, a laptop computer, a portable computer, a web tablet, a wireless phone, a cellular phone, and a digital music player, or various devices that can send and receive information in wireless communication environments.

The system 900 may include a controller 910, an input/output device 920, such as a keypad, a keyboard, or a display, a memory 930, and a wireless interface 940, which are coupled to each other through a bus 950. The controller 910 may include, for example, one or more microprocessors, digital signal processors, microcontrollers, or similar processors. The memory 930 may be used to store, for example, commands that are executed by the controller 910. In addition, the memory 930 may be used to store user data. The memory 930 may include a nonvolatile memory device disclosed herein. The memory 930 may include a volatile memory device that can be accessed at any time, and other various kinds of memories.

The system 900 may use the wireless interface 940 that sends and receives data through a wireless communication network that communicates with a radio frequency (RF) signal. For example, the wireless interface 940 may include an antenna and a wireless transceiver.

The system 900 according to an embodiment of the present inventive concept may be used in a communication interface protocol, that is, the next-generation communication system, such as CDMA (Code Division Multiple Access), GSM (Global System for Mobile Communication), NADC (North American Digital Cellular), TDMA (Time Division Multiple Access), E-TDMA (Extended Time Division Multiple Access), WCDMA (Wideband Code Division Multiple Access), or CDMA 2000. The memory device according to example embodiments of the present inventive concept may be applied to a memory card to be described later with reference to FIG. 13.

Figure 13:
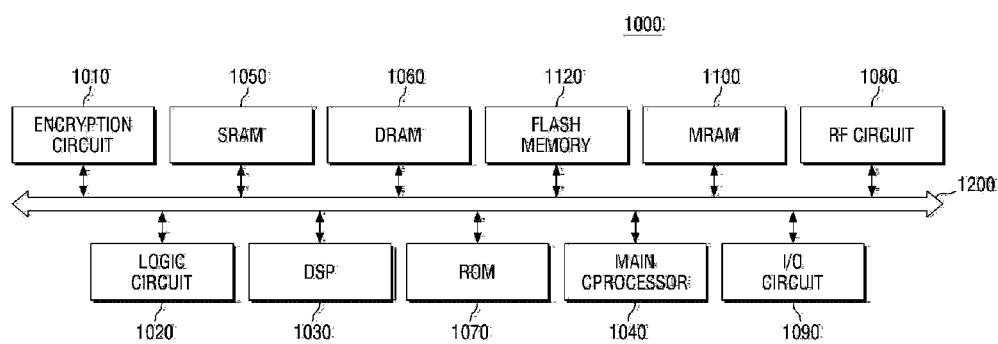
FIG. 13 is a block diagram exemplarily illustrating the configuration of a memory card including a memory device according to certain embodiments of the present inventive concept is applied.

FIG. 13 is a block diagram exemplarily illustrating a memory card to which a memory device disclosed herein is applied.

Referring to FIG. 13, a memory card 1000 includes an encryption circuit 1010 for encryption, a logic circuit 1020, a digital signal process (DSP) 1030 that is a dedicated processor, and a main processor 1040. Further, the memory card 1000 may include a nonvolatile memory device (e.g., MRAM) 1100 disclosed herein, and other various kinds of memories, for example, SRAM 1050, DRAM 1060, ROM 1070, and a flash memory 1120. Further, the memory card 1000 may include an RF (high frequency/microwave) circuit 1080, and an input/output circuit 1090. Function blocks 1010 provided in the memory card 1000 may be connected to each other through a system bus 1200. The memory card 1000 operates under the control of an external host, and the nonvolatile memory device 1100 according to embodiments of the present inventive concept may store data or output the stored data under the control of the host.

Although the example embodiments of the present disclosure have been described for illustrative purposes, those skilled in the art will appreciate that various modifications, additions and substitutions are possible, without departing from the scope and spirit of the inventive concept as disclosed in the accompanying claims.

What is claimed is:

1. A memory device including nonvolatile memory cells, each of which comprises:

an active pattern including first to fourth regions successively arranged in one direction;

a first gate structure crossing the active pattern on the second region and including a first gate electrode and a first insulating layer; and a second gate structure crossing the active pattern on the fourth region and including a second gate electrode and a second insulating layer, wherein the nonvolatile memory cell is configured such that:

a first voltage is applied to the second gate electrode when the second insulating layer is in a first state such that a current that passes through the second region becomes a first current, the first voltage is applied to the second gate electrode when the second insulating layer is in a second state such that a current that passes through the second region becomes a second current, the first voltage is applied to the second gate electrode when the second insulating layer is in a third state such that a current that passes through the second region becomes a third current, the second current and the third current are higher than the first current, and the second current is different from the third current.

2. The memory device of claim 1, wherein if the nonvolatile memory cell is a One-Time Programmable (OTP) cell, the first state is a state before the second insulating layer is programmed, and wherein if the nonvolatile memory cell is a Multi-Time Programmable (MTP) cell, the first state is a state before the second insulating layer is formed.

3. The memory device of claim 2, an area of each of the first and second gate electrodes of the OTP cell overlapping the active pattern is greater than an area of each of the first and second gate electrodes of the MTP cell overlapping the active pattern.

4. The memory device of claim 2, wherein the second state of the OTP cell does not change to the first state, and wherein the second and third states of the MTP cell are changeable with each other.

5. The memory device of claim 4, wherein the second state is changed to the third state by applying a second voltage to the second gate electrode, and wherein the third state is changed to the second state by applying a third voltage equal to or less than the second voltage to the second gate electrode.

6. The memory device of claim 1, wherein if the nonvolatile memory cell is a One-Time Programmable (OTP) cell, the second state is a state where the second insulating layer is programmed by a second voltage that is applied to the second gate electrode and is higher than the first voltage.

7. The memory device of claim 6, wherein the second insulating layer comprises an interface layer and a high-k dielectric layer that are successively formed on the active pattern, and wherein the second state occurs by a breakdown at the interface layer in the second state.

8. The memory device of claim 1, wherein if the nonvolatile memory cell is a Multi-Time Programmable (MTP) cell, the second state is a state where the second insulating layer is set or formed by a second voltage that is applied to the second gate electrode and is higher than the first voltage, and the third state is a state where the second insulating layer is reset by a third voltage that is applied to the second gate electrode and is higher than the first voltage and is lower than the second voltage, and wherein the second current is higher than the third current.

9. The memory device of claim 8, wherein the second insulating layer comprises an interface layer and a high-k dielectric layer that are successively formed on the active pattern, and
   wherein a breakdown does not occur at the interface layer in the second state or the third state.

10. The memory device of claim 1, further comprising:
   an interlayer insulating layer including a first trench and a second trench and formed on the active pattern,
   wherein the first insulating layer includes a first interface layer formed on a bottom surface of the first trench and a first high-k insulating layer formed on the first interface layer along side surfaces and the bottom surface of the first trench, and
   wherein the second insulating layer includes a second interface layer formed on a bottom surface of the second trench and a second high-k insulating layer formed on the second interface layer along side surfaces and the bottom surface of the second trench.

11. A memory device including nonvolatile memory cells, each of which comprises:
   an active pattern including first to fourth regions successively arranged in one direction;
   a first gate structure crossing the active pattern on the second region and including a first gate electrode and a first insulating layer; and
   a second gate structure crossing the active pattern on the fourth region and including a second gate electrode and a second insulating layer,
   wherein the first region is connected to a sense amplifier that detects a current passing through the second region,
   wherein if the nonvolatile memory cell is a One-Time Programmable (OTP) cell before the second insulating layer is programmed or is a Multi-Time Programmable (MTP) cell before the second insulating layer is formed, the second insulating layer has a first resistance value,
   wherein if the nonvolatile memory cell is the OTP cell, the second insulating layer has a second resistance value that is smaller than the first resistance value in the nonvolatile memory cell that is in a programmed state, and
   wherein if the nonvolatile memory cell is the MTP cell, the second insulating layer has a third resistance value that is smaller than the first resistance value and is larger than the second resistance value in the nonvolatile memory cell that is in a set state.

12. The memory device of claim 11, wherein the set state of a nonvolatile memory cell occurs when a first voltage is applied to the second gate electrode, and
   wherein a reset state of a nonvolatile memory cell occurs and the second insulating layer has a fourth resistance value greater than the third resistance value and smaller than the first resistance value, when a second voltage lower than the first voltage is applied to the second gate electrode.

13. The memory device of claim 11, wherein if the nonvolatile memory cell is the MTP cell, the second insulating layer has a fourth resistance value smaller than the first resistance value and greater than the third resistance value of the nonvolatile memory cell that is in a reset state,
   wherein when a read voltage is applied to the second gate electrode to read a data that is written in the nonvolatile memory cell, a current that flows through the second insulating layer having the first resistance value becomes a first current, a current that flows through the second insulating layer having the second resistance value becomes a second current, a current that flows through the second insulating layer having the third resistance value becomes a third current, and a current that flows through the second insulating layer having the fourth resistance value becomes a fourth current, and
   wherein a ratio of the second current to the first current is higher than a ratio of the third current to the fourth current.

14. A memory device comprising:
   a row decoder configured to select a word line of a plurality of word lines;
   a column decoder configured to select a bit line of a plurality of bit lines;
   a first set of memory cells connected to corresponding word lines of the plurality of word lines and corresponding bit lines of the plurality of bit lines, each memory cell of the first set of memory cells having a first state and a second state opposite to the first state; and
   a second set of memory cells connected to corresponding word lines of the plurality of word lines and corresponding bit lines of the plurality of bit lines, each memory cell of the second set of memory cells having a third state and a fourth state opposite to the third state,
   wherein a first memory cell of the first set of memory cells having a first resistance value has the first state and a second memory cell of the first set of memory cells having a second resistance value less than the first resistance value has the second state, and
   wherein a first memory cell of the second set of memory cells having a third resistance value less than the first resistance value and greater than the second resistance value has the third state, and a second memory cell of the second set of memory cells having a fourth resistance value less than the third resistance value and greater than the second resistance value has the fourth state.

15. The memory device of claim 14, wherein the first and second memory cells of the first set of memory cells and the first and second memory cells of the second set of memory cells are connected to the same word line.

16. The memory device of claim 14, wherein each respective memory cell of the first and second sets of memory cells includes first and second transistors connected in series to each other,
   wherein the first transistor includes a gate, a first end that is floating and a second end, and
   wherein the second transistor includes a gate connected to a word line of the plurality of the word lines, a first end and connected to the second end of the first transistor, and a second end connected to a bit line of the plurality of bit lines.

17. The memory device of claim 16, wherein the second memory cell of the first set of memory cells has the second state when a first voltage applied to the gate of the first transistor of the second memory cell,
   wherein the first memory cell of the second set of memory cells has the third state when a second voltage less than the first voltage applied to the gate of the first transistor of the first memory cell of the second set of memory cells, and
   wherein the second memory cell of the second set of memory cells has the fourth state when a third voltage less than the first voltage and greater than the second voltage applied to the gate of the first transistor of the second memory cell of the second set of memory cells.

18. The memory device of claim 17, wherein the gate of each of first and second transistors of each respective memory cell of the first and second sets of memory cells includes a first insulating layer, a second insulating layer formed on the first insulating layer, and a gate electrode formed on the second insulating layer, wherein a conduction path is formed through first and second insulating layers of the first transistor of the second memory cell of the first set of memory cells, wherein a conduction path is formed through a portion of the second insulation layer of the first transistor of the first memory cell of the second set of memory cells, the portion of the second insulation layer not entirely penetrating the second insulation layer in a column direction, and wherein a conduction path is formed through the second insulating layer of the first transistor of the second memory cell of the second set of memory cells.

19. The memory device of claim 14, wherein the second state of the second memory cell of the first set of memory cells does not change to the first state, and wherein the third and fourth states of the first and second memory cells of the second set of memory cells are changeable with each other.

20. The memory device of claim 19, wherein the third state of the first memory cell of the second set of memory cells is changed to the fourth state by applying a first voltage to the gate of the first transistor of the first memory cell of the second set of memory cells, and wherein the fourth state of the second memory cell of the second set of memory cells is changed to the third state by applying a second voltage equal to or less than the first voltage to the gate of the first transistor of the second memory cell of the second set of memory cells.

* * * * *